United States Patent
Hanaoka

(10) Patent No.: US 8,599,233 B2
(45) Date of Patent: Dec. 3, 2013

(54) VERTICAL CAVITY SURFACE EMITTING LASER ELEMENT, VERTICAL CAVITY SURFACE EMITTING LASER ARRAY, OPTICAL SCANNING DEVICE, AND IMAGE FORMING APPARATUS

(75) Inventor: Katsunari Hanaoka, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 13/147,239

(22) PCT Filed: Dec. 22, 2009

(86) PCT No.: PCT/JP2009/071854
§ 371 (c)(1),
(2), (4) Date: Aug. 1, 2011

(87) PCT Pub. No.: WO2010/106720
PCT Pub. Date: Sep. 23, 2010

(65) Prior Publication Data
US 2011/0316961 A1 Dec. 29, 2011

(30) Foreign Application Priority Data

Mar. 18, 2009 (JP) .................. 2009-065667
Sep. 18, 2009 (JP) .................. 2009-217914

(51) Int. Cl.
*B41J 2/45* (2006.01)
*H01S 5/00* (2006.01)

(52) U.S. Cl.
USPC .................. 347/238; 372/46.011

(58) Field of Classification Search
USPC .......... 347/224, 225, 238; 372/43.01–50.124, 372/75, 96
See application file for complete search history.

(56) References Cited

U.S. PATENT DOCUMENTS

| 5,493,577 A | 2/1996 | Choquette et al. |
| 5,545,925 A | 8/1996 | Hanaoka |
| 5,589,712 A | 12/1996 | Kawashima et al. |

(Continued)

FOREIGN PATENT DOCUMENTS

| JP | 10-125999 | 5/1998 |
| JP | 2003-86895 | 3/2003 |

(Continued)

OTHER PUBLICATIONS

International Search Report and Written Opinion in PCT/JP2009/071854.

(Continued)

*Primary Examiner* — Hai C Pham
(74) *Attorney, Agent, or Firm* — Cooper & Dunham LLP

(57) ABSTRACT

A disclosed vertical cavity surface emitting laser element includes a substrate, a laminated body sandwiching a semiconductor active layer with an upper reflecting mirror and a lower reflecting mirror, a lower electrode, and an upper electrode. The laser element emits laser light in a direction perpendicular to the surface of the substrate when an electric current is supplied between the upper electrode and the lower electrode. The laser element further includes a selective oxidation layer in the upper reflecting mirror having a current blocking structure made of an oxidized region and an unoxidized region, and a detectable portion formed on a side surface of a mesa structure shaped by the upper reflecting mirror including the selective oxidation layer and the active layer, thereby enabling detecting the position of the selective oxidation layer from a top of the laminated body in a depth direction of the laminated body.

9 Claims, 12 Drawing Sheets

(56) References Cited

U.S. PATENT DOCUMENTS

| | | | |
|---|---|---|---|
| 5,656,841 A | 8/1997 | Watanabe et al. | |
| 5,976,971 A | 11/1999 | Kinpara et al. | |
| 6,001,720 A | 12/1999 | Hanaoka et al. | |
| 6,014,400 A * | 1/2000 | Kobayashi | 372/96 |
| 6,816,527 B2 * | 11/2004 | Ueki | 372/46.01 |
| 2003/0139060 A1 | 7/2003 | Sai | |
| 2004/0042519 A1 | 3/2004 | Sakamoto et al. | |
| 2007/0280322 A1 | 12/2007 | Sato et al. | |
| 2008/0056321 A1 * | 3/2008 | Motomura et al. | 372/45.01 |
| 2008/0233017 A1 | 9/2008 | Sato et al. | |
| 2011/0211604 A1 * | 9/2011 | Roscher | 372/35 |

FOREIGN PATENT DOCUMENTS

| | | |
|---|---|---|
| JP | 2003-133285 | 5/2003 |
| JP | 2003-179309 | 6/2003 |
| JP | 2004-95934 | 3/2004 |
| JP | 2006-228811 | 8/2006 |
| JP | 2006-332623 | 12/2006 |
| JP | 2007-266592 | 10/2007 |
| JP | 2008-172101 | 7/2008 |
| JP | 2009-38227 | 2/2009 |
| JP | 2010-21418 | 1/2010 |

OTHER PUBLICATIONS

Japanese official action dated Mar. 26, 2013 in corresponding Japanese patent application No. 2009-217914.

Korean official action dated Jan. 30, 2013 in connection with corresponding Korean patent application No. 10-2011-7021036.

Japanese official action dated Sep. 3, 2013 in corresponding Japanese patent application No. 2009-217914.

European Search report dated Sep. 4, 2013 in corresponding European patent application No. 09 84 1922.9.

* cited by examiner

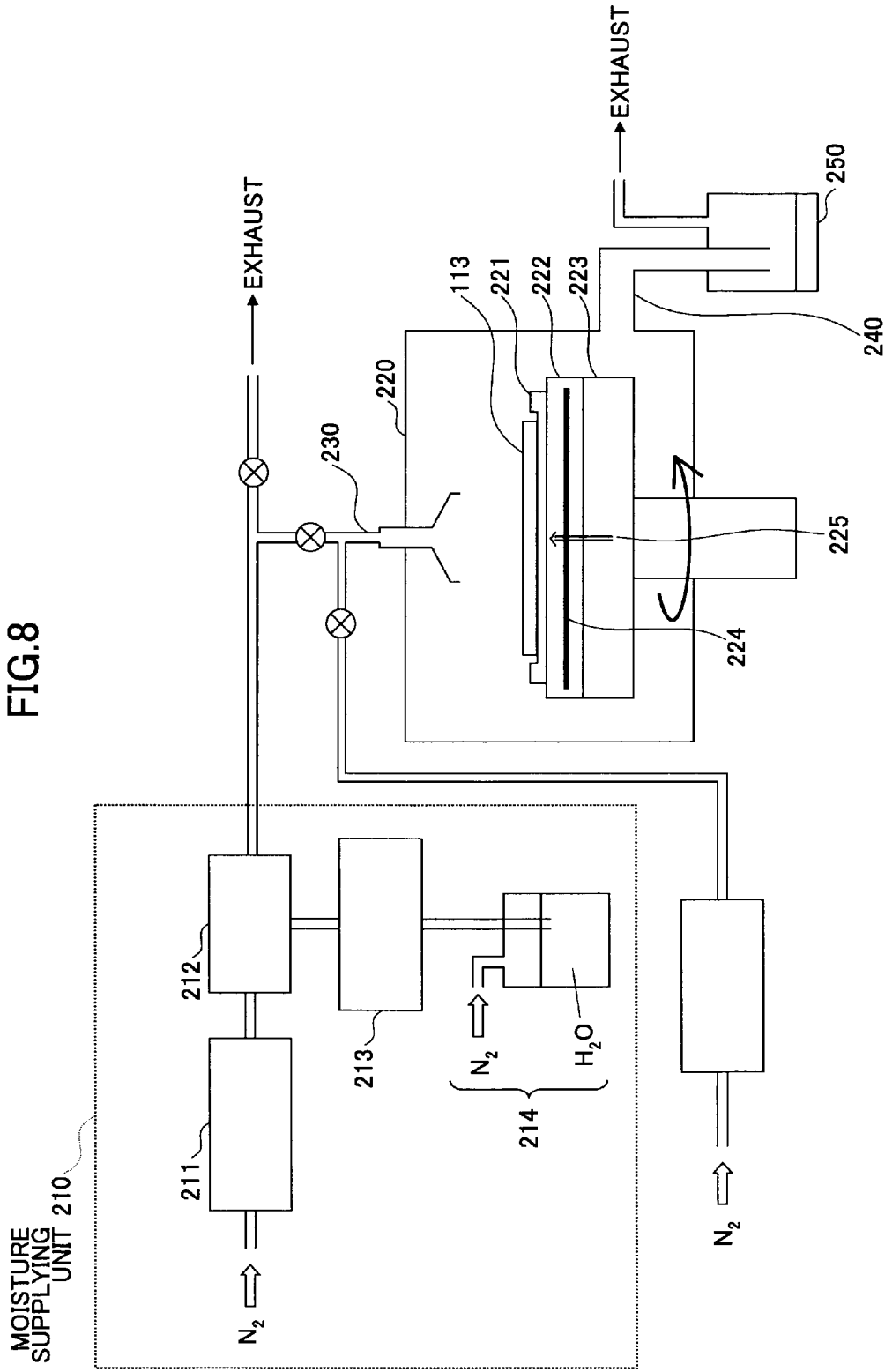

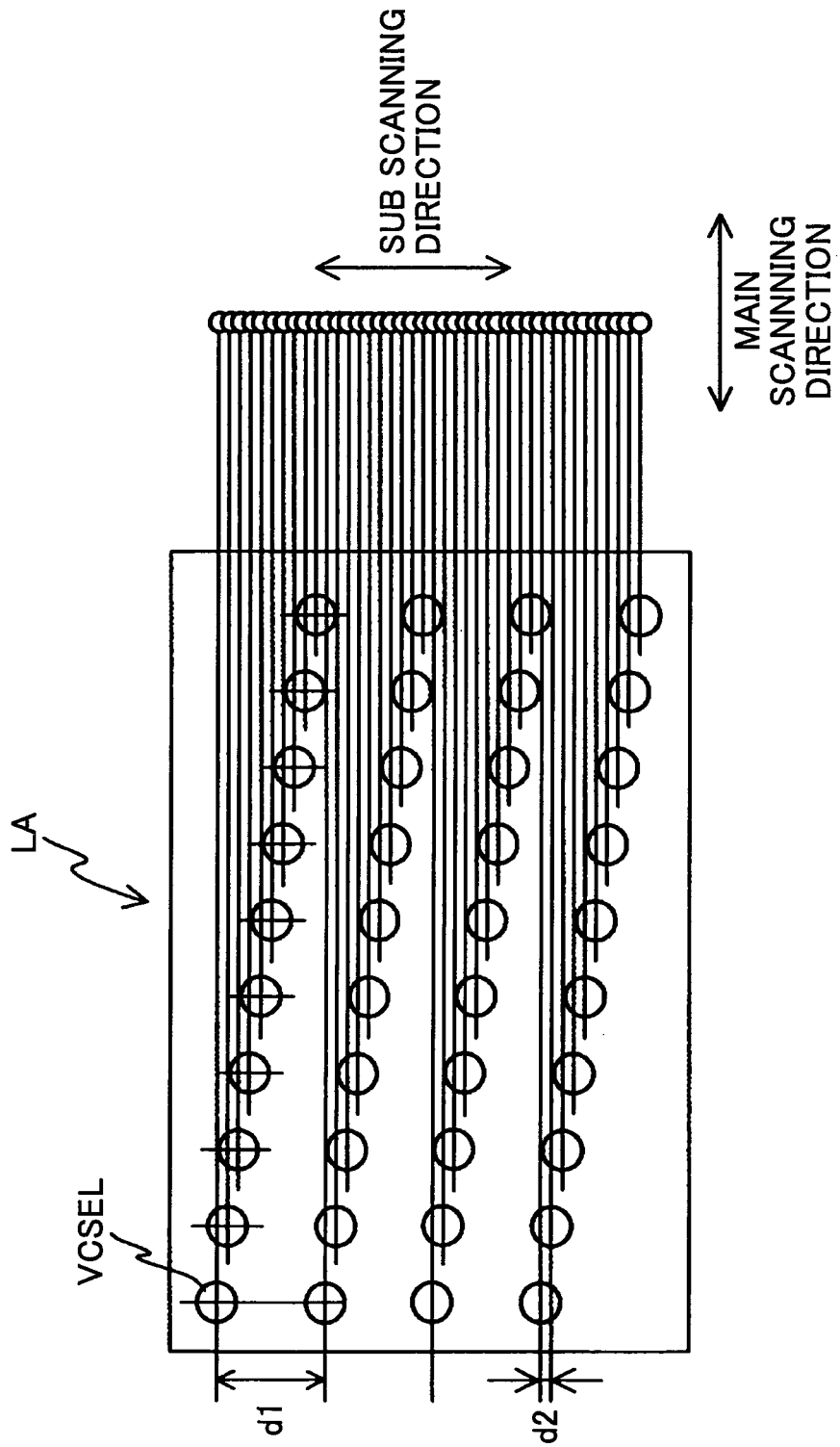

VERTICAL CAVITY SURFACE EMITTING LASER ELEMENT, VERTICAL CAVITY SURFACE EMITTING LASER ARRAY, OPTICAL SCANNING DEVICE, AND IMAGE FORMING APPARATUS

TECHNICAL FIELD

The present invention relates to a vertical cavity surface emitting laser (VCSEL) element, a vertical cavity surface emitting laser array, an optical scanning device, and an image forming apparatus.

BACKGROUND ART

The vertical cavity surface emitting laser (VCSEL) element propagates in a direction perpendicular to a substrate. In comparison with an ordinary edge emitting type semiconductor laser, the vertical cavity surface emitting laser element can be achieved at a low cost, low power consumption and in a compact device, suitable for a two-dimensional device. For these reasons, the vertical cavity surface emitting laser elements attract the attention of many people.

As disclosed in, for example, U.S. Pat. No. 5,493,577, the vertical cavity surface emitting laser element has a current blocking structure and employs a selective oxidation and confined structure made of AiAs or the like.

The current blocking structure of the vertical cavity surface emitting laser element is formed by arranging a semiconductor substrate or a semiconductor member having a mesa structure of a circular shape or a rectangular or quadrangular shape in a high-temperature steam atmosphere, oxidizing it from an outer peripheral portion on a side surface of the mesa structure, made of a p-AlAs or AlGaAs layer, to the center of the mesa structure, and forming a selective oxidation layer made of a region of the oxidized AlO and an unoxidized region. The refractive index of the oxidized region of the selective oxidation layer is about 1.6, which is lower than those of the other semiconductor layers. Therefore, emitted beams are confined in the unoxidized region surrounded by the oxidized region to thereby lower a threshold value.

Meanwhile, when the size of the unoxidized region in the selective oxidation layer deviates from an optimum value, an oscillation characteristic of light output or the like is also deviated. Thus, there may occur a problem of drop in yield.

In order to avoid such a deviation of the unoxidized region of the selective oxidation layer from the predetermined size, there have been proposed several methods.

A method of indirectly monitoring the degree of oxidation using a monitored oxidation pattern is disclosed in Japanese Unexamined Patent Application Publication No. 2004-95934. With this method, a pattern of stripes is provided to monitor an oxidation rate in addition to a shape of an ordinary resonator, and reflectance of the pattern is measured inside an oxidation chamber to obtain the degree of oxidation.

A method of monitoring the degree of oxidation in real time is disclosed in Japanese Unexamined Patent Application Publication No. 2003-179309. With this method, a semiconductor member under an oxidation process is observed via an observation port with a microscope, and the degree of oxidation is estimated using contrast observed with the microscope between an oxidized region and an unoxidized region, thereby controlling the oxidation to follow.

In the method of indirectly monitoring the degree of oxidation using the monitored oxidation pattern disclosed in Japanese Unexamined Patent Application Publication No. 2004-95934, there are problems including that an area for mounting the vertical cavity surface emitting laser element is limited and cost becomes high. This is because it is necessary to make patterns around the monitored oxidation pattern blank to enable monitoring the oxidation rate with high accuracy, and an ordinary resonator cannot be mounted by this blank pattern.

Further, in the method of observing the degree of oxidation with the microscope disclosed in Japanese Unexamined Patent Application Publication No. 2003-179309, it is necessary to enhance the degree of oxidation and also shorten the distance between a semiconductor member and the microscope to focus the microscope on a portion where the mesa structure is formed. However, when the distance between the observation port and the semiconductor member is shortened, moisture vapor concentration distribution on the semiconductor member is scattered, and therefore the amount of oxidation becomes not uniform. Thus, the yield is lowered. Further, when the distance between the observation port and the semiconductor member is shortened, the refractive index of the observation port may be changed by heat emitted from a heater, and optical elements such as a lens installed in the microscope may be deformed. In these cases, the focus is deviated to degrade measurement accuracy. Thus, the yield may be lowered. Further, because it is impossible to reuse the microscope in this method, the cost may become higher.

DISCLOSURE OF INVENTION

Accordingly, it is a general object of the present invention to provide novel and useful vertical cavity surface emitting laser elements, vertical cavity surface emitting laser arrays, optical scanning devices, and image forming apparatuses with substantially uniform laser emission properties at low cost.

Another and more specific object of the present invention is to provide a vertical cavity surface emitting laser element which has an oxidation region having a substantially uniform feature at low cost in a process of manufacturing an oxidized current blocking layer.

According to an aspect of embodiments of the present invention, there is provided a vertical cavity surface emitting laser element including a substrate, a laminated body formed by sandwiching a semiconductor active layer with an upper reflecting mirror and a lower reflecting mirror and positioned on a surface of the substrate, a lower electrode connected to another surface of the substrate opposite to the surface, and an upper electrode connected to an upper surface of the upper reflecting mirror, wherein the upper reflecting mirror and the lower reflecting mirror are respectively fabricated by alternately laminating semiconductor films having different refractive indexes, and
the vertical cavity surface emitting laser element emitting laser light in a direction perpendicular to the surface of the substrate when an electric current is supplied between the upper electrode and the lower electrode, the vertical cavity surface emitting laser element further including a selective oxidation layer in the upper reflecting mirror having a current blocking structure made of an oxidized region and an unoxidized region, and a detectable portion which is formed on a side surface of a mesa structure shaped by the upper reflecting mirror including the selective oxidation layer and the active layer, thereby enabling detecting a position of the selective oxidation layer from a top of the laminated body in a depth direction of the laminated body.

According to another aspect of embodiments of the present invention, there is provided the vertical cavity surface emitting laser element, whereby the detectable portion is a step shaped by changing a taper angle of a side surface of the mesa structure.

According to another aspect of embodiments of the present invention, there is provided the vertical cavity surface emitting laser element, whereby the detectable portion is formed at a depth position corresponding to a depth position of the selective oxidation layer from the top of the laminated body.

According to another aspect of embodiments of the present invention, there is provided the vertical cavity surface emitting laser element, whereby the side surface of the mesa structure is shaped to have a taper angle larger in a lower part of the mesa structure than that in an upper part of the mesa structure, and a depth position of the detectable portion, at which the taper angle changes between the lower part and the upper part of the mesa structure, is the same as or higher than the depth position of the selective oxidation layer.

According to another aspect of embodiments of the present invention, there is provided the vertical cavity surface emitting laser element, whereby an insulating film is formed on the side surface of the mesa structure.

According to another aspect of embodiments of the present invention, there is provided the vertical cavity surface emitting laser element, whereby the upper electrode is formed on the insulating film, and a thickness of the upper electrode is thicker than a height of the lower part of the mesa structure.

According to another aspect of embodiments of the present invention, there is provided the vertical cavity surface emitting laser element, whereby the active layer has a multiple quantum well structure.

According to another aspect of embodiments of the present invention, there is provided the vertical cavity surface emitting laser element, whereby the mesa structure is formed with plasma etching, and a pressure applied at a time of forming the lower part of the mesa structure and a pressure applied at a time of forming the upper part of the mesa structure are different.

According to another aspect of embodiments of the present invention, there is provided a vertical cavity surface emitting laser array including plural vertical cavity surface emitting laser elements.

According to another aspect of embodiments of the present invention, there is provided an optical scanning device that scans a surface of an object with a light beam including a light source unit including the vertical cavity surface emitting laser array, a deflection unit configured to deflect the light beam from the light source unit, and a scanning optical system configured to converge the deflected light beam to the surface of the object.

According to another aspect of embodiments of the present invention, there provided an optical scanning device that scans a surface of an object with plural light beams including a light source unit including the vertical cavity surface emitting laser array, a deflection unit configured to deflect the plural light beams from the light source unit, and a scanning optical system configured to converge the deflected light beams to the surface of the object.

According to another aspect of embodiments of the present invention, there is provided an image forming apparatus including one or more image holding units, one or more of the optical scanning devices configured to scan the one or more holding units with a light beam corresponding to an image, and a transferring unit configured to transfer the image formed on the image holding unit to a transferred object.

According to another aspect of embodiments of the present invention, there is provided an image forming apparatus including one or plurality of image holding units, one or plurality of the optical scanning devices configured to scan the one or plurality of holding units with plural light beams corresponding to an image, and a transferring unit configured to transfer the image formed on the image holding unit to a transferred object.

Other objects, features, and advantages of the present invention will become more apparent from the following detailed description when read in conjunction with the accompanying drawings.

BRIEF DESCRIPTION OF THE DRAWINGS

FIG. 8 illustrates a structure of an oxidation device.

FIG. 12 is a view for explaining resolution using a laser array.

BEST MODE FOR CARRYING OUT THE INVENTION

A description will now be given with reference to FIG. 1 through FIG. 12 of the Embodiments of the present invention.

Hereinafter, reference signs typically designate as follows:
11: n-GaAs inclined substrate;
12: lower distribution Bragg reflector (DBR) layer;
13: lower spacer layer;
14: active layer;
15: upper spacer layer;
16: selective oxidation layer;
17: upper distribution Bragg reflector (DBR) layer;
18: insulating film;
19: positive electrode;
20: negative electrode;
30: resonator;
31: oxidized region;
32: unoxidized region;
41: mesa structure lower part;
42: mesa structure upper part;
43: step portion (detectable portion);
N: height of mesa structure lower part; and
T: thickness of p-side electrode.

Embodiment 1

A vertical cavity surface emitting laser element according to Embodiment 1 is described.

<Structure of the Vertical Cavity Surface Emitting Laser Element (VCSEL)>

Figure 1:
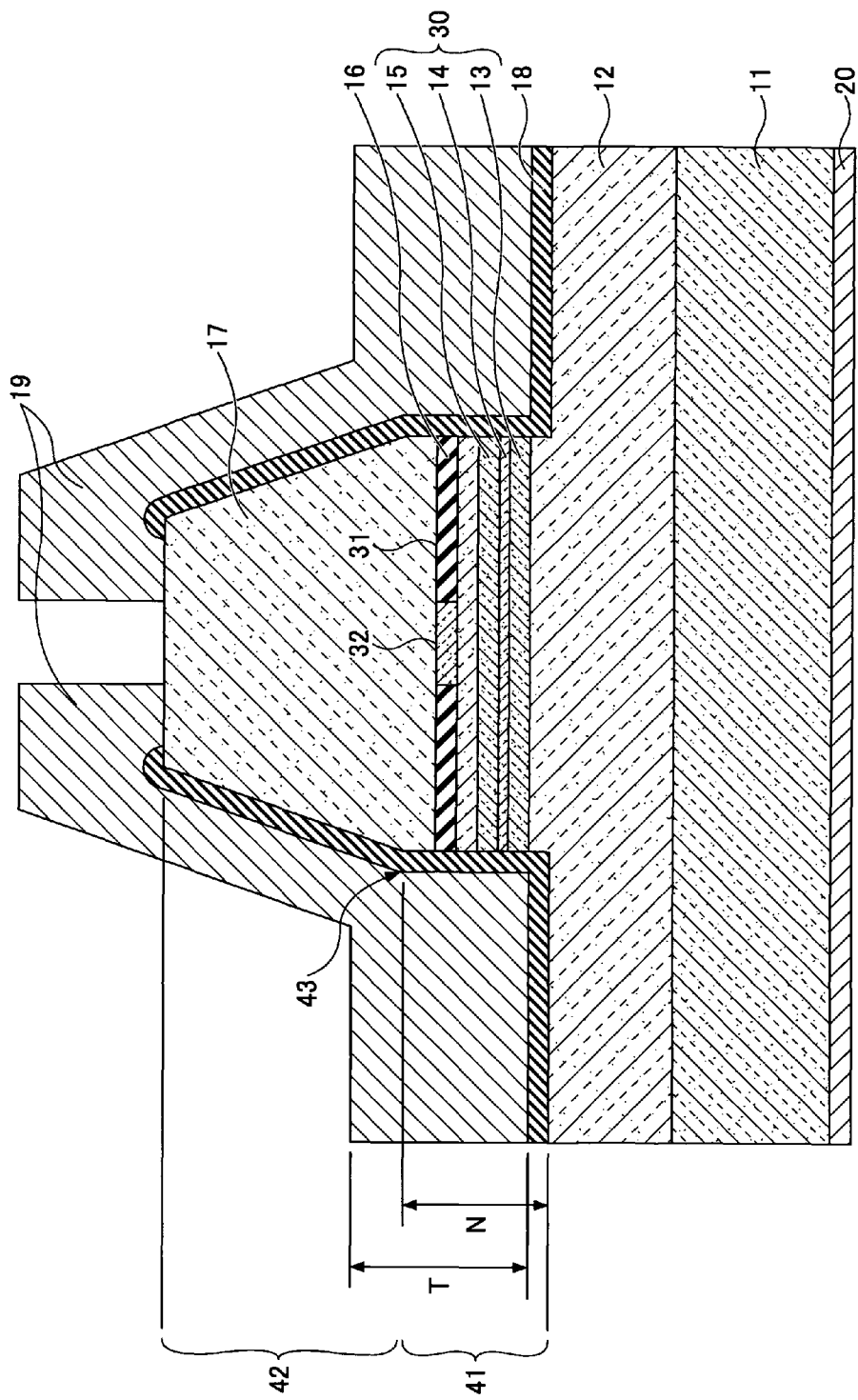
FIG. 1 illustrates the structure of a vertical cavity surface emitting laser element according to Embodiment 1.

FIG. 1 illustrates a structure of the vertical cavity surface emitting laser element according to Embodiment 1 of the present invention. The 780 nm vertical cavity surface emitting laser element of Embodiment 1 is formed by epitaxially growing a lower semiconductor DBR layer 12, a lower spacer layer 15, an active layer 14, an upper spacer layer 15, a selective oxidation layer 16, and an upper semiconductor DBR layer 17 on an n-GaAs inclined substrate 11. The lower spacer layer 13, the active layer 14, the upper spacer layer 15, the selective oxidation layer 16, the upper semiconductor layer 17, and a part of the lower semiconductor DBR layer 12 are formed to have a mesa structure. A mesa structure upper part 42 including a side surface of the mesa structure is formed the have a moderate angle relative to a substrate plane, and a mesa structure lower part 41 has an angle steeper than the mesa structure upper part 42.

Here, the moderate taper angle is 73° thru 78° of the n-GaAs inclined substrate 11 relative to the surface plane, and the greater taper angle is 85° thru 90°, being substantially vertical to the substrate plane. At the position where the taper angle changes between the mesa structure upper part 42 and the mesa structure lower part 41, a step portion 43 is formed. As described below, the selective oxidation layer 16 is formed at a time of forming the upper semiconductor DBR layer 17.

An inter-layer insulating film 18 made of silicon oxide or silicon nitride is formed to cover the side surface of the mesa structure and a surface of the lower spacer layer 13. A positive electrode 19 is formed on the upper semiconductor DBR layer 17 and the inter-layer insulating film 18. A negative electrode 20 is formed on a back surface of the n-GaAs inclined substrate 11.

The n-GaAs inclined substrate 11 is a n-GaAs single crystal substrate with a normal line of its mirror polished substrate surface inclined from a direction of [100] to a direction of [111]A by 15°.

The lower semiconductor DBR layer 12 is formed by alternately laminating a low refractive index layer made from n-$Al_{0.93}Ga_{0.07}As$ and a high refractive index layer made from n-$Al_{0.3}Ga_{0.7}As$. The number of pairs of the low refractive index layers and the high refractive index layers is forty two point five (42.5) pairs.

The lower spacer layer 13 is made from $Al_{0.33}Ga_{0.67}As$.

The active layer 14 has a triple quantum well structure made from GaInAsP/$Al_{0.33}Ga_{0.67}As$.

The upper spacer layer 15 is made from $Al_{0.33}Ga_{0.67}As$. A resonator 30 is formed by the lower spacer layer 13, the active layer 14, and the upper spacer layer 15.

The upper semiconductor DBR layer 17 is formed by alternately laminating a low refractive index layer made from p-$Al_{0.93}Ga_{0.07}As$ and a high refractive index layer made from p-$Al_{0.33}Ga_{0.67}As$. The number of pairs of the low refractive index layers and the high refractive index layers is thirty two (32) pairs.

The selective oxidation layer 16 is the low refractive index layer in the second pair counting from the upper spacer layer 15 in the upper semiconductor DBR layer 17. The selective oxidation layer 16 is made from p-AlAs and has a thickness of 20 nm. The selective oxidation layer 16 includes an oxidized region 31 and an unoxidized region 32 as described below. In the vertical cavity surface emitting laser element, an electric current passes through the unoxidized region 32 where the electric current is blocked. Therefore, the selective oxidation layer 16 including the unoxidized region 32 is also called as current blocking layer.

Further, the step portion 43, at which the taper angle of the mesa structure changes, is formed at a position similar, in a depth direction from a top of the upper semiconductor DBR layer 17, to a position where the selective oxidation layer 16 is formed. The step portion 43 functions as a detectable portion for detecting a position of the selective oxidation layer 16 in the depth direction from the top of the upper semiconductor DBR layer 17. As described later, it is possible to measure an outer diameter of the mesa structure by detecting the step portion 43 with a microscope or the like. The taper angle (an angle between the substrate surface and the side surface of the mesa structure) of the mesa structure lower part 41 is 85 thru 90°, and the taper angle of the mesa structure upper part 42 is 73 thru 78°.

As described, the step portion 43 functions as the detectable portion for enabling detecting the position of the selective oxidation layer 16 in the depth direction from the top of the upper semiconductor DBR layer 17. When the mesa structure lower part 41 has the steep angle of 85° thru 90° as in this example, even though the step portion 43 is positioned higher than the position where the selective oxidation layer 16 is formed, a positional difference between the step portion 43 and the selective oxidation layer 16 along the depth direction can be ignored; the resulting accuracy of measuring the outer diameter of the side surface of the mesa structure is scarcely lowered. Therefore, the step portion 43 may be at a position similar to or a little higher than that of the selective oxidation layer 16, along the depth direction. Referring to the mesa structure illustrated in FIG. 1, the thickness T of the positive electrode 19 is greater than the height N of the mesa structure lower part 41. Therefore, it is possible to prevent the positive electrode 19 from being disconnected at about the lower end of the mesa structure lower part 41, at which the taper angle of the mesa structure is steep.

<Method of Manufacturing the Vertical Cavity Surface Emitting Laser Element>

Next, the method of manufacturing the vertical cavity surface emitting laser element according to Embodiment 1 is described.

Figure 2:
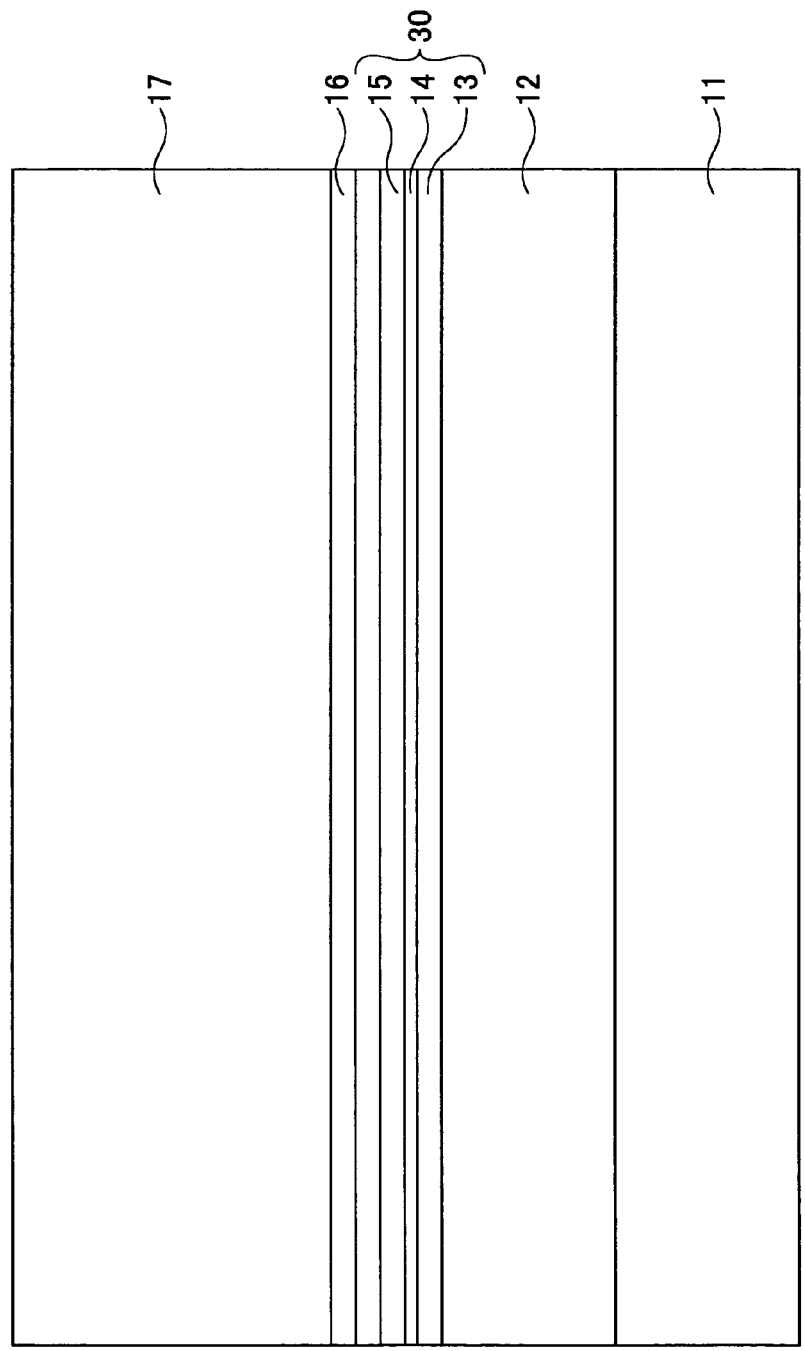
FIG. 2 illustrates a first step of a manufacturing process of the vertical cavity surface emitting laser element according to Embodiment 1.

First, as illustrated in FIG. 2, the lower semiconductor DBR layer 12, the lower spacer layer 13, the active layer active layer 14, the upper spacer layer 15, the selective oxidation layer 16, and the upper semiconductor DBR layer 17 are epitaxially formed on the n-GaAs inclined substrate 11 as the semiconductor substrate. The films may be formed by growing crystals with a molecular beam epitaxy (MBE) method or a molecular beam epitaxial growth method.

Figure 3:
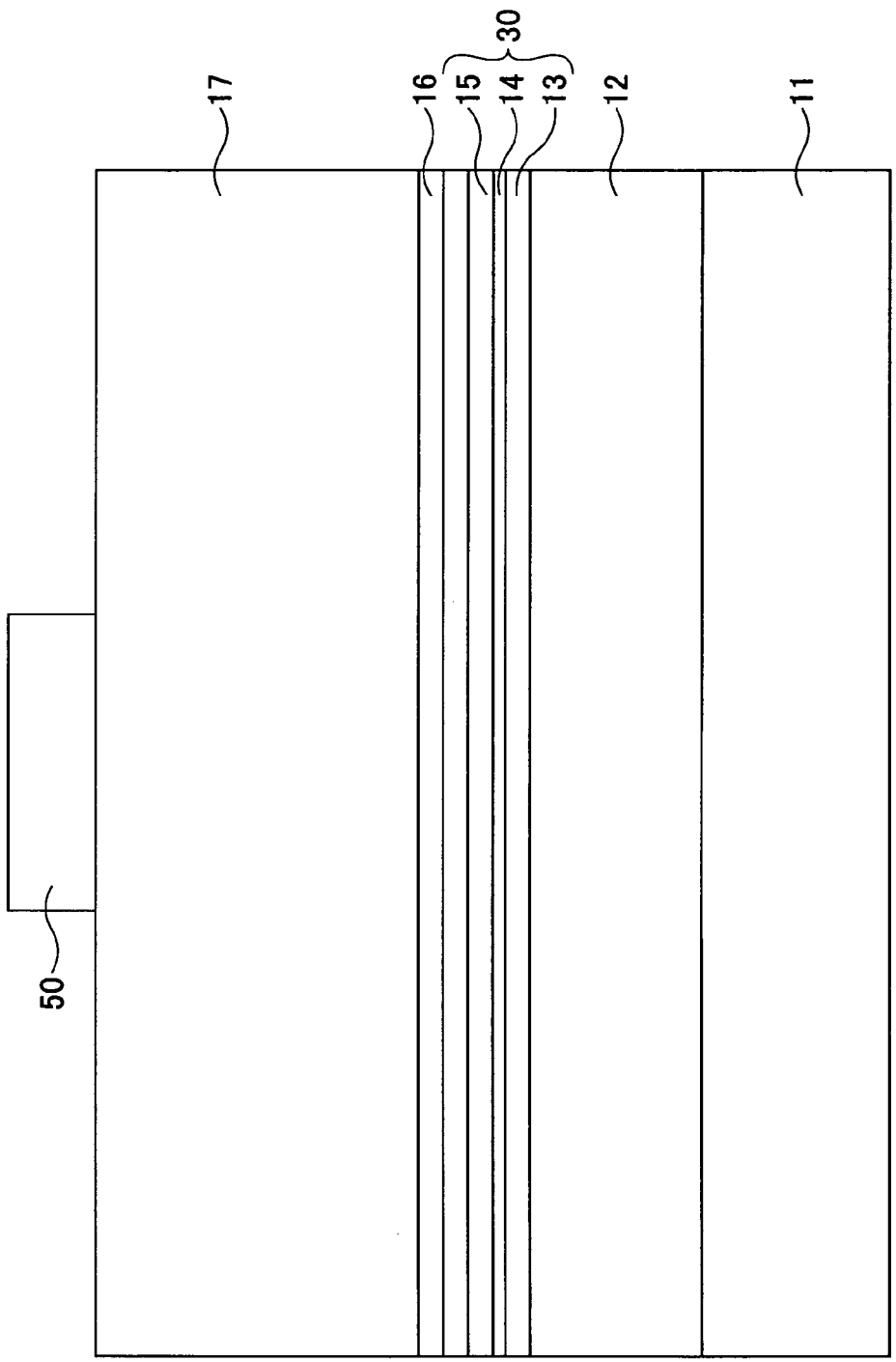
FIG. 3 illustrates a second step of the manufacturing process of the vertical cavity surface emitting laser element according to Embodiment 1.

As illustrated in FIG. 3, a resist pattern 50 of a square, 20 μm on a side, is formed on a surface of the upper semiconductor DBR layer 17. The resist pattern 50 is provided for forming the mesa structure. After coating the surface of the upper semiconductor DBR layer 17 with photo resist, the upper semiconductor DBR layer 17 is exposed to light and developed. In the vertical cavity surface emitting laser element of Embodiment 1, the n-GaAs inclined substrate 11 with various layers formed on it is referred to as a semiconductor member 113 (see FIG. 7).

Figure 4:
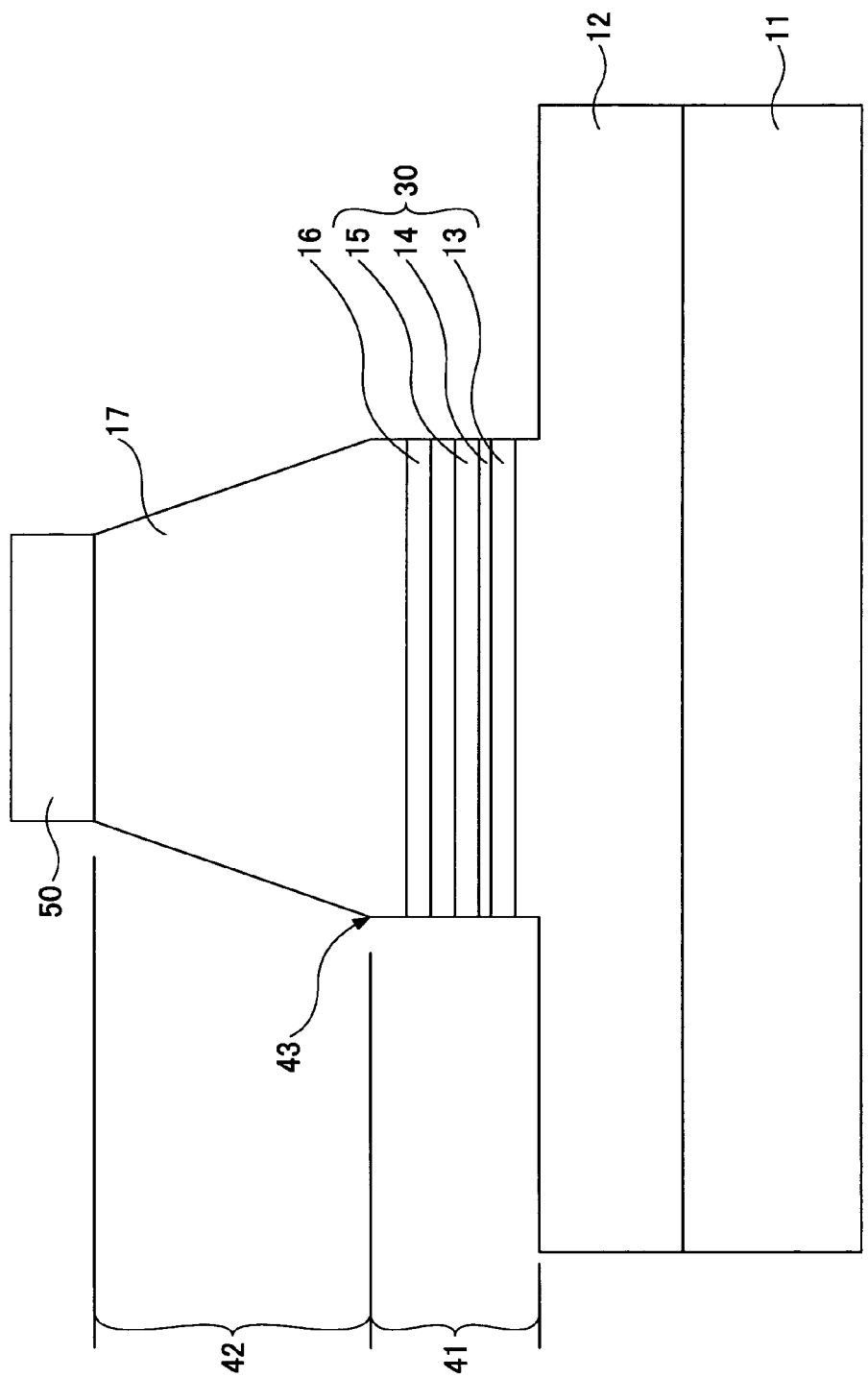
FIG. 4 illustrates a third step of the manufacturing process of the vertical cavity surface emitting laser element according to Embodiment 1.
Figure 7:
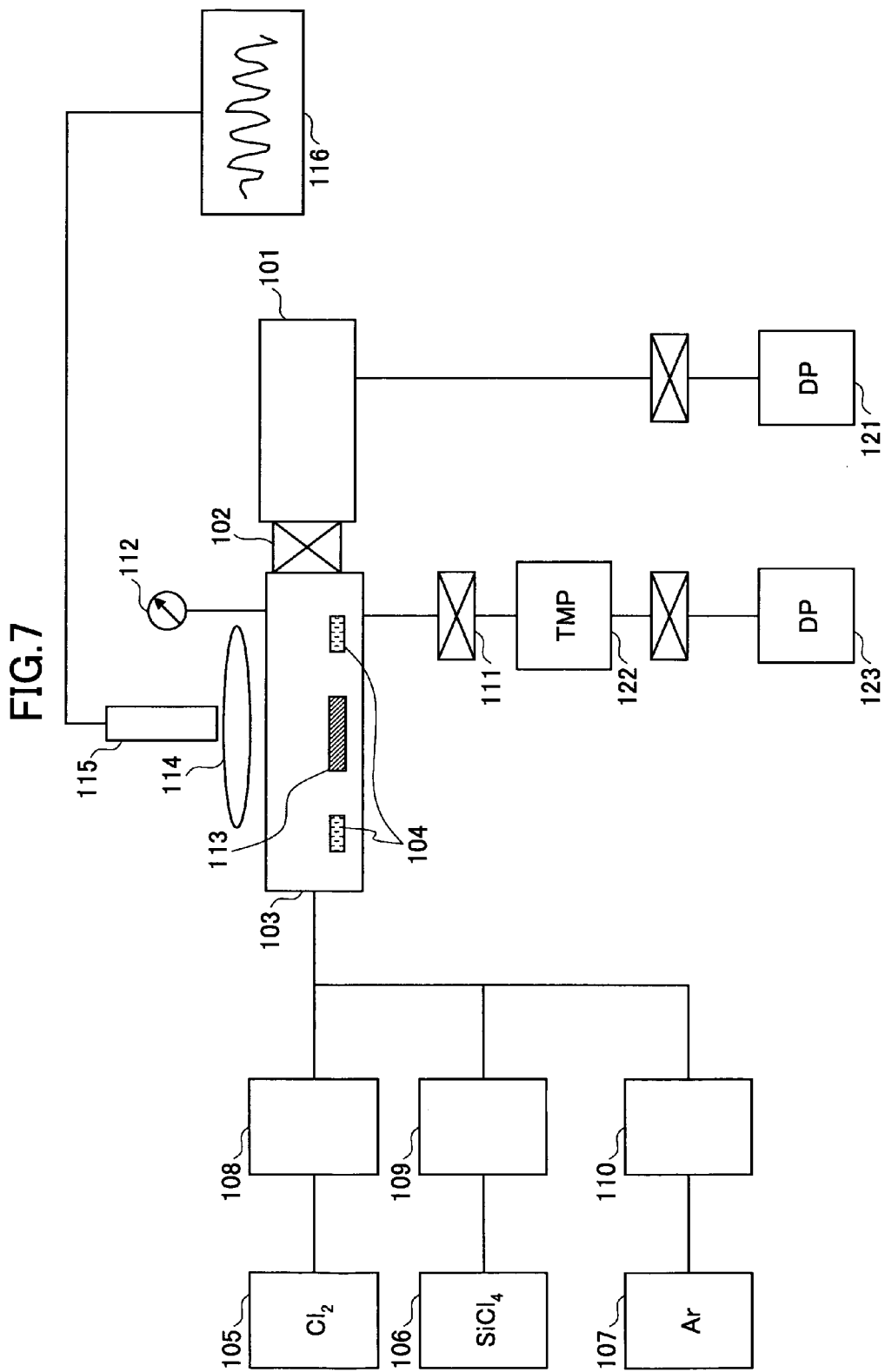
FIG. 7 illustrates a structure of an inductively coupled plasma (ICP) plasma etching device.

As illustrated in FIG. 4, the mesa structure of a trapezoidal shape in its side view is formed by an inductively-coupled plasma (ICP) etching device using the resist pattern as a mask. FIG. 7 is a schematic view of the ICP etching device for forming the mesa structure.

After inserting the semiconductor member 113 with the resist pattern 50 illustrated in FIG. 3 formed on it into a load lock chamber 101 and exhausting for ten (1) minutes with a dry pump 121, a gate valve 102 is opened and the semiconductor member 113 is carried to a reaction chamber 103. Silicon 104 in a ring-like shape is accommodated in the reaction chamber 103 so that a reaction product of the silicon 104 contributes to etching of GaAs system material.

After keeping the semiconductor member 113 inside the reaction chamber 103 for ten (10) minutes, a $Cl_2$ gas is introduced into the reaction chamber from a chlorine ($Cl_2$) gas cylinder 105 at 2 standard cc/min (sccm); a $SiCl_4$ gas is introduced at 1 sccm from a silicon tetrachloride ($CCl_2$) gas cylinder 106; and an Ar gas is introduced at 3 sccm from an argon (Ar) gas cylinder 107. Mass flow controllers 108, 109 and 110 are connected to the gas cylinders 105, 106 and 107, respectively, in order to control flow rates of the gases from the gas cylinders.

Further, the reaction chamber 103 is exhausted by a turbo-molecular pump 122 and a dry pump 123. A flow adjusting valve 111 is connected between the reaction chamber 103 and the turbo-molecular pump 122.

A pressure gauge 112 is provided to measure the pressure inside the reaction chamber 103. The opening degree of the flow adjusting valve 111 is adjusted based on the pressure measured by the pressure gauge 112 so as to maintain a predetermined pressure inside the reaction chamber 103.

When the inner pressure of the reaction chamber 103 is constantly in a value range 0.1 thru 0.3 Pa, the ICP plasma etching device manufactures the vertical cavity surface emitting laser element having a stable taper angle of the mesa structure of 73° thru 78°. When the inner pressure of the reaction chamber 103 is in a value range between 0.3 thru 0.5 Pa, the ICP plasma etching device manufactures the vertical cavity surface emitting laser element having a widely scattered taper angle range 73° thru 90°. When the inner pressure of the reaction chamber 103 is in a value range 0.6 thru 1.0 Pa, the ICP plasma etching device manufactures the vertical cavity surface emitting laser element having a stable taper angle in a range between 85° thru 90°.

Therefore, an upper portion of the mesa structure down to 500 nm from the bottom of the mesa structure is etched under the pressure of 0.3 Pa to make the taper angle of the mesa structure moderate. Specifically, after a lapse of 30 seconds from the introduction of the $Cl_2$ gas, the $SiCl_4$ gas, and the Ar gas, an electric power of 400 W is supplied to an induction coil 114. Thus, the mesa structure upper part 42, which is higher than 500 nm above the bottom of the mesa structure, is formed to have the taper angle of 73° thru 78°.

Thereafter, the electric power supplied to the induction coil 114 is cut of, and the opening degree of the flow adjusting valve 111 is controlled to maintain the inner pressure of the reaction chamber 103 to be 1.0 Pa. Next, the inner pressure of 1.0 Pa is maintained for thirty (30) seconds, and electric power of 400 W is supplied to the induction coil 114 to etch the semiconductor member 113. Thereafter, the semiconductor member 113 is etched by 500 nm, and the electric power supplied to the induction coil is cut off. After the etching, a surface of the lower spacer layer 13 is exposed. In this way, the mesa structure lower part 41, which is positioned up to 500 nm above the bottom of the mesa structure, is formed to have the taper angle of 85° thru 90°.

As described, the mesa structure made up of the mesa structure upper part 42 having the moderate taper angle and the mesa structure lower part 41 having the steep taper angle are formed. The step portion 43 is formed at a contacting portion between the mesa structure lower part 41 and the mesa structure upper part 42, on the side surface of the upper DBR layer 17 of the mesa structure. Further, the position of the step portion is similar to or higher than, in the depth direction from the top of the upper semiconductor DBR layer 17, the position of the selective oxidation layer 16.

An etching condition can be measured as a change of reflectance by a reflectance measuring device 115, which is provided on a upper portion of the reaction chamber 103 via a sapphire window (not shown). By confirming the condition displayed on the reflectance monitor 116, it is possible to know which layer is currently being etched. Therefore, the taper angles can be changed by controlling the conditions of introducing the gases as described above.

Figure 5:
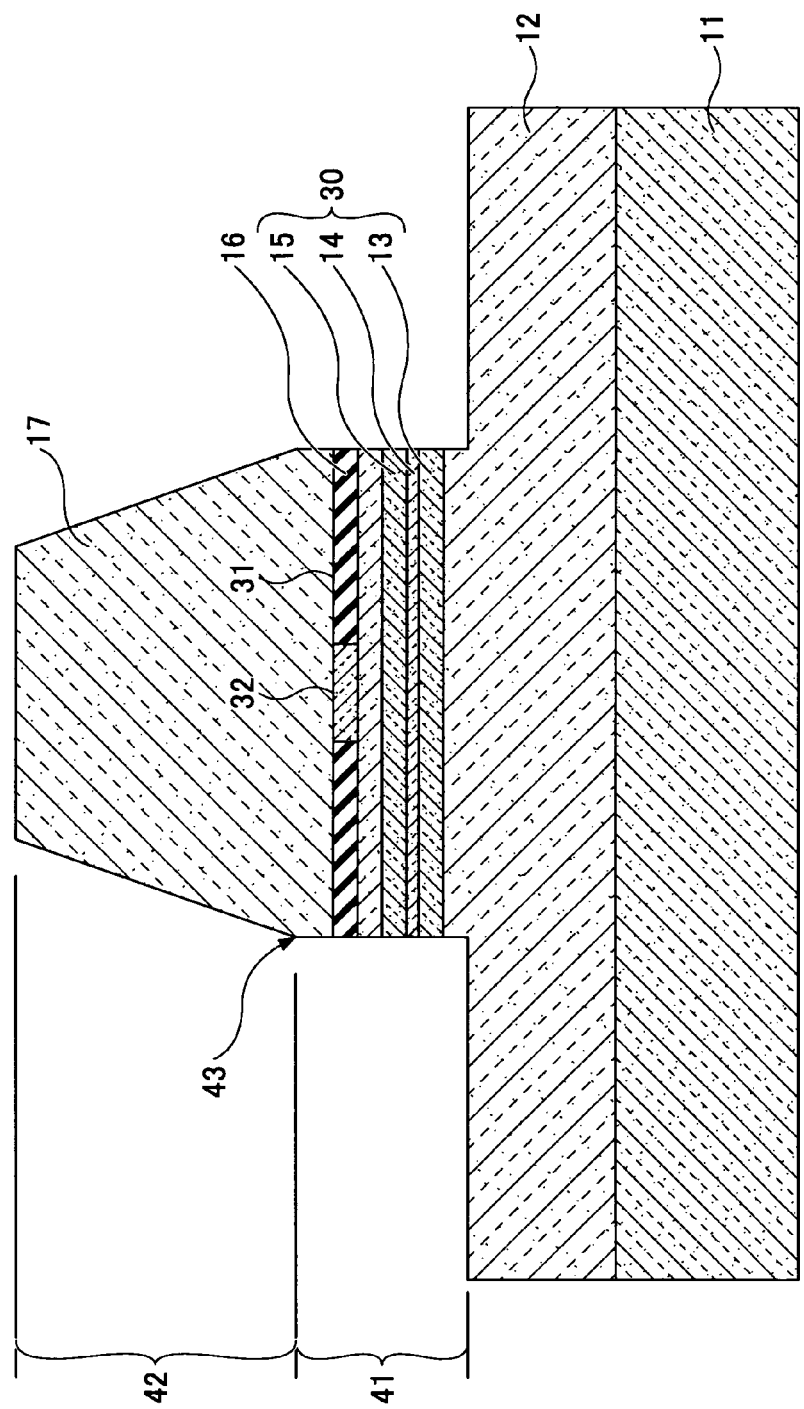
FIG. 5 illustrates a fourth step of the manufacturing process of the vertical cavity surface emitting laser element according to Embodiment 1.

Next, as illustrated in FIG. 5, the resist pattern 50 is removed. Then, the oxidized region 31 is formed in the selective oxidation layer 16. Specifically, after removing the resist pattern 50, an image of the mesa structure is taken at a hundredfold (100) magnification by a metallographic microscope from an upper portion of the semiconductor member 113, and the diameter of the side surface of the mesa structure is measured by image-editing software or the like. A processing time T of an oxidation current blocking process is obtained by plugging an outer diameter value M of the oxidized current blocking layer, which is obtained by measuring the outer diameter of the side surface portion of the mesa structure, a radius OA of the predetermined unoxidized region, and an oxidation rate V into Formula (I) as follows.

$$T=(M-OA)/2 \times V \qquad \text{[Formula 1]}$$

The oxidation current blocking process is carried out based on the processing time obtained by Formula 1. Specifically, the selective oxidation layer 16 is formed by oxidizing with an oxidation device.

FIG. 8 illustrates a structure of the oxidation device. The oxidation device includes a moisture supplying unit 210, a stainless reaction container 220, an intake pipe 230, an exhaust pipe 240, a water collector 250, a temperature controller (not shown), or the like.

The moisture supplying unit 210 includes a mass flow controller 211, a vaporizer 212, a liquid mass flow controller 213, and a water supplying unit 214, wherein the moisture vapor is supplied to the stainless reaction container 220.

The stainless reaction container 220 includes a tray 221 on which the semiconductor member 113 is mounted so as to be oxidized, a heating table 222 having a disc-like shape and integrated with a ceramic heater 224 for heating the semiconductor member 113 through the tray 221, a thermo couple 225 for measuring the temperature of the semiconductor member 113, and a rotary base 223 supporting to rotate the heating table 222. The temperature controller (not shown) controls an electric current or an electric voltage supplied to the ceramic heater 224 while monitoring an output signal from the thermo couple 225 to constantly maintain a preset temperature (retention temperature) of the semiconductor member 113 for a preset time period (retention time period).

In the oxidation device illustrated in FIG. 8, when a nitrogen ($N_2$) gas is introduced into the water supplying unit 214, a flow rate of water ($H_2O$) is controlled by the liquid mass flow controller 213, and the water is supplied to the vaporizer 212. The supplied water is changed into moisture vapor by the vaporizer 212. The flow rate of a $N_2$ carrier gas is controlled by the mass flow controller 211 as the $N_2$ carrier gas is introduced in the vaporizer 212, and the $N_2$ carrier gas entrains moisture vapor. The $N_2$ carrier gas and the moisture vapor are supplied to the inside of the stainless reaction container 220 via the intake pipe 230.

The $N_2$ carrier gas containing the moisture vapor supplied inside the stainless reaction container 220 reaches at and around the semiconductor member 113. In this way, the semiconductor member 113 is exposed to a moisture vapor atmosphere to gradually enhance oxidation from a periphery of a portion of the semiconductor member 113 corresponding to the selective oxidation layer 16. Thus, the oxidized region 31 is formed in the selective oxidation layer 16. Thereafter, the $N_2$ carrier gas is exhausted from the exhaust pipe 240 and the water collector 250.

The oxidation is carried out under conditions in which the flow rate of the supplied water is 80 gram per hour (g/hr), the flow rate of the $N_2$ carrier gas is 20 standard liter per minute (SLM), for example, at 1 atm and 0° C., the retention temperature is 410° C., and the time period T is 11.3 minutes, which is obtained by Formula 1. Thus, the selective oxidation layer 16 including the unoxidized region 32 which is the current blocking region of the 3.5 μm square and the oxidized region 31 surrounding the unoxidized region 32 is formed.

Figure 6:
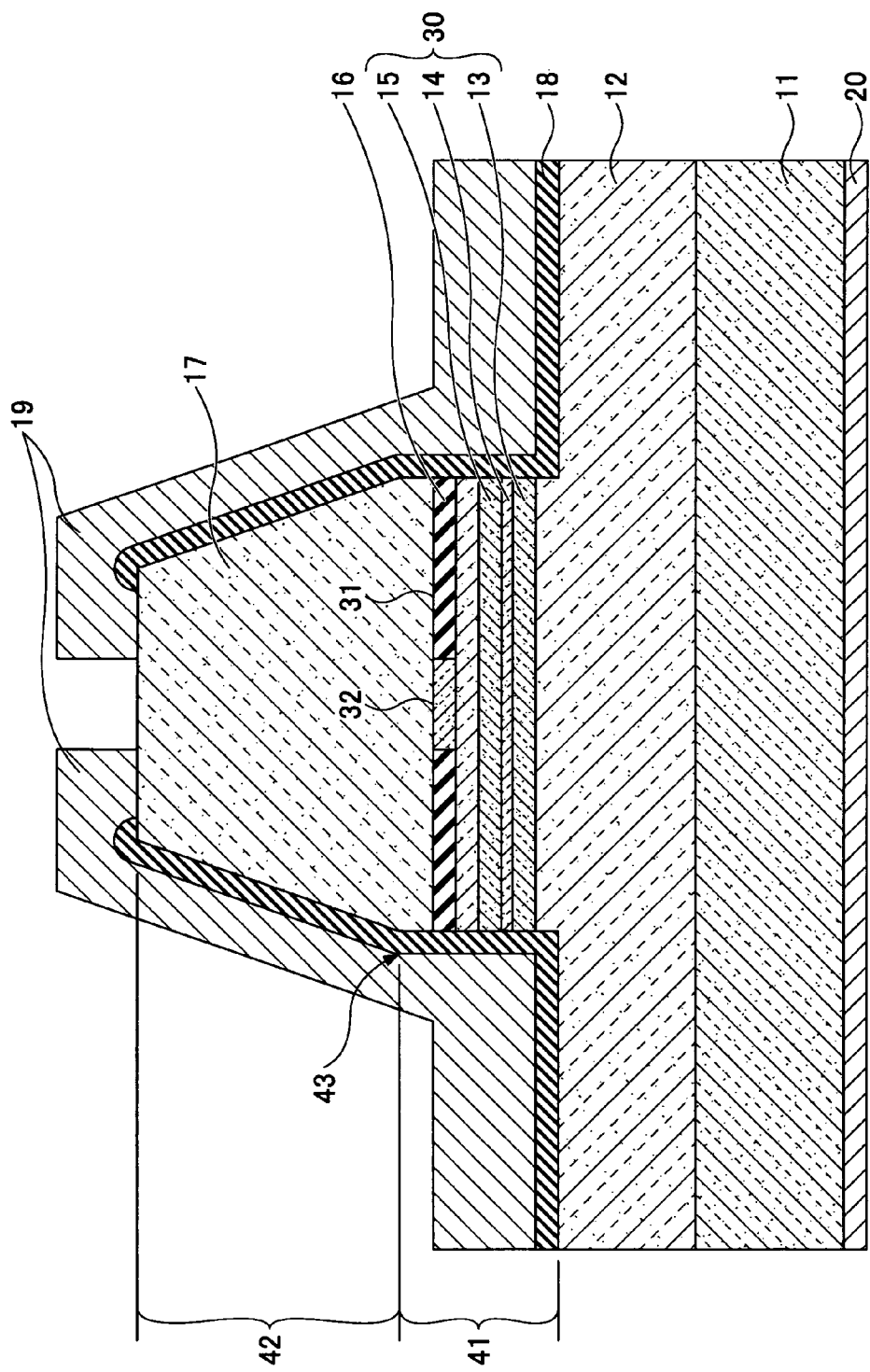
FIG. 6 illustrates a fifth step of the manufacturing process of the vertical cavity surface emitting laser element according to Embodiment 1.

Referring to FIG. 6, after the inter-layer insulating film 18 is formed, the positive electrode 19 and the negative electrode 20 are formed. Specifically, the inter-layer insulating film 18 made of silicon oxide or silicon nitride is formed at a predetermined region.

Then, a silicon nitride (SiN) film 150 nm thick is formed. On the top of the mesa structure having the trapezoidal shape in its side view, a resist pattern for a 18-μm-square opening is formed on the SiN film. The SiN film is etched in a region where the resist pattern is not formed by a buffered hydrofluoric acid to form an opening 18-μm-square in the top of the mesa structure.

Next, a resist pattern for forming the positive electrode 19 is formed, and metallic films of Cr, AuZn and Au are laminated in this order with a vacuum deposition method to have a total thickness of 750 nm. Then, the laminated metallic films are subjected to lift off to thereby form the positive electrode 19.

Then, after polishing a back surface of the n-GaAs inclined substrate 11, which is a semiconductor substrate, metallic films of AuGe, Ni and Au are laminated on the polished back surface in this order with a vacuum deposition method. Thus, the negative electrode 20 is formed.

Thereafter, the semiconductor member is subjected to heat treatment at 400° C. for four (4) minutes.

Figure 9A:
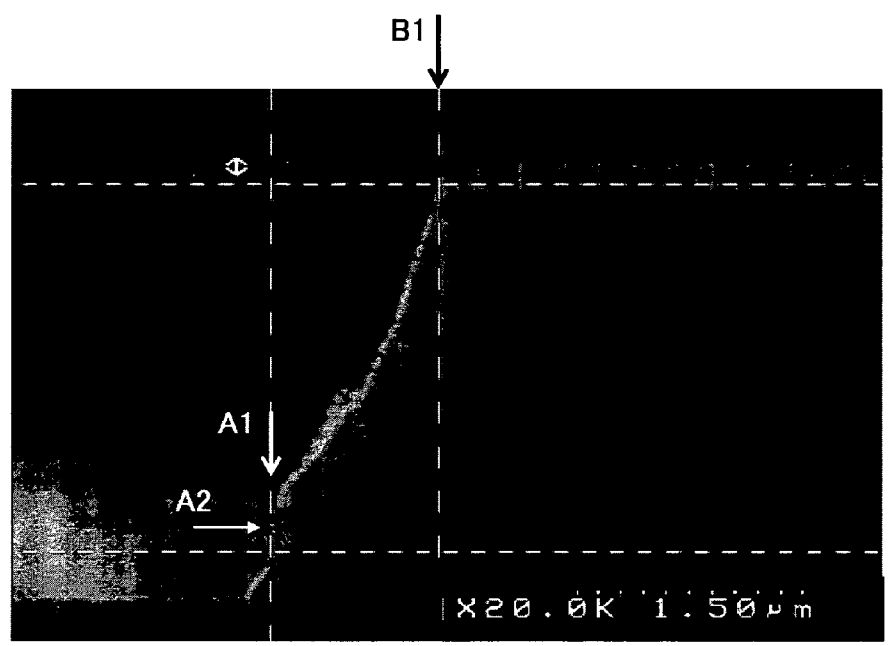
FIGS. 9A and 9B are photocopies of cross-sectional views of vertical cavity surface emitting laser elements taken by a scanning electron microscope (SEM).
Figure 9B:
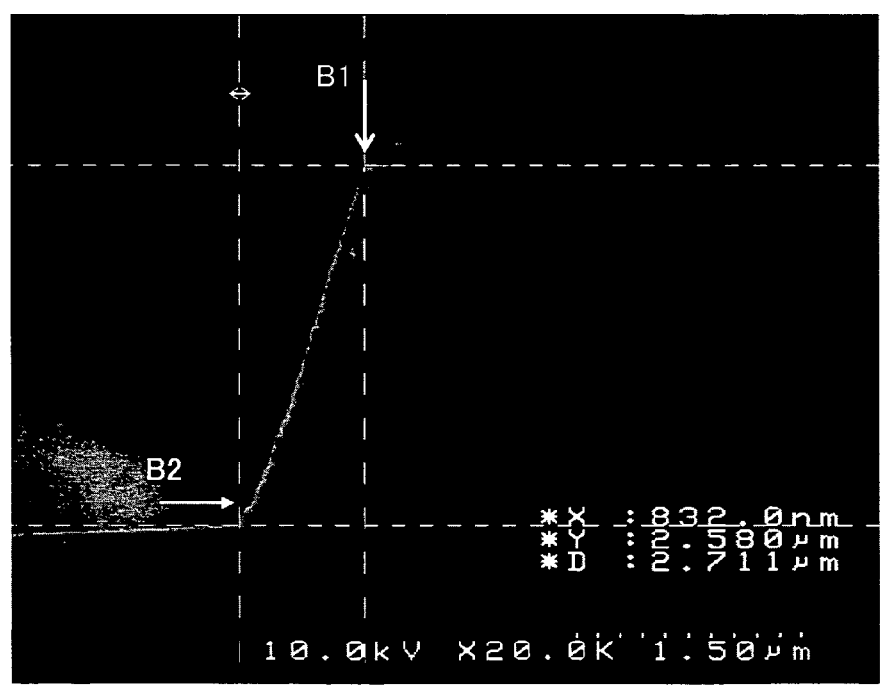

FIGS. 9A and 9B are photocopies of cross-sectional views of vertical cavity surface emitting laser elements taken by a scanning electron microscope (SEM). FIG. 9A is the photocopy of the side cross-sectional view of the mesa structure of the vertical cavity surface emitting laser element according to the Embodiment. FIG. 9B is the photocopy of the side cross-sectional view of the mesa structure of the vertical cavity surface emitting laser element according to the related art.

Referring to FIG. 9A, in Embodiment 1, arrow B1 indicates a measured position (mesa top), arrow A1 indicates a measured position in Embodiment 1 of the present invention, and arrow A2 indicates a blocking oxidation layer. Referring to FIG. 9B, in the related art, arrow B1 indicates a measured position (mesa top), and arrow B2 indicates a blocking oxidation layer.

On the side surfaces of the mesa structures, the inter-layer insulating films are formed. Further, the positive electrodes 19 are formed on the inter-layer insulating films. In the mesa structure upper part and the mesa structure lower part, when the taper angles of the mesa structures are large, disconnections are apt to occur. In such a case, yield may drop. Therefore, the mesa structure is ordinarily formed to have a moderate taper angle as illustrated in FIG. 9B.

However, when the mesa structure is formed to have the moderate taper angle, it is difficult to accurately know the width value of a portion where a selective oxidation layer functioning as the current blocking layer is formed. Said differently, the width value of the portion, in which a selective oxidation layer functioning as the current blocking layer is formed, can be observed only from above. In order to observe from the sides, it would be necessary to destroy the semiconductor member 113 during manufacture. When the mesa structure having the moderate taper angle as illustrated in FIG. 9B is observed from above, an error may be increased in determining the width value of the portion in which the selective oxidation layer functioning as the current blocking layer is formed. This is because the error of the width value of the selective oxidation layer formed at the position indicated by the arrow B2 becomes large because the mesa structure can be observed from arrow B1 of FIG. 9B. Therefore, the size of the unoxidized region in the selective oxidation layer largely scatters to thereby cause a drop of yield.

However, when a mesa structure has a steep taper angle at a portion in which the selective oxidation layer 16 is formed on the side surface as illustrated in FIG. 9A, a step portion can be formed between a mesa structure upper part having a moderate taper angle and a mesa structure lower part having a steep taper angle. Then, it becomes possible to more accurately observe from above the width of the portion in which the selective oxidation layer functioning as the current blocking layer is formed. Therefore, the mesa structure can be observed from not only arrow B1 but also arrow A1 to thereby accurately detect the width of the selective oxidation layer 16 formed at a position indicated by arrow A2. As a result, it becomes possible to determine a position of a portion, in which the selective oxidation layer 16 is formed, in an upper semiconductor DBR layer 17, in a depth direction from a top of the upper semiconductor DBR layer 17, to thereby enable to measure an outer diameter of a side surface of the mesa structure. Therefore, it is possible to determine the outer diameter value M of the oxidized current blocking layer of the selective oxidation layer 16.

According to the vertical cavity surface emitting laser element of Embodiment 1, the unoxidized region in the selective oxidation layer 16 can be uniformly manufactured to thereby prevent yield from dropping, and disconnection of the positive electrode 19 or the like is avoidable to thereby prevent yield from dropping.

According to the vertical cavity surface emitting laser element of Embodiment 1, because an accuracy of forming the current blocking region in the selective oxidation layer 16 is high, it is possible to manufacture a vertical cavity surface emitting laser array using the vertical cavity surface emitting laser elements in high yield.

Embodiment 2

An image forming apparatus of Embodiment 2 is described.

<Laser Printer>

Figure 10:
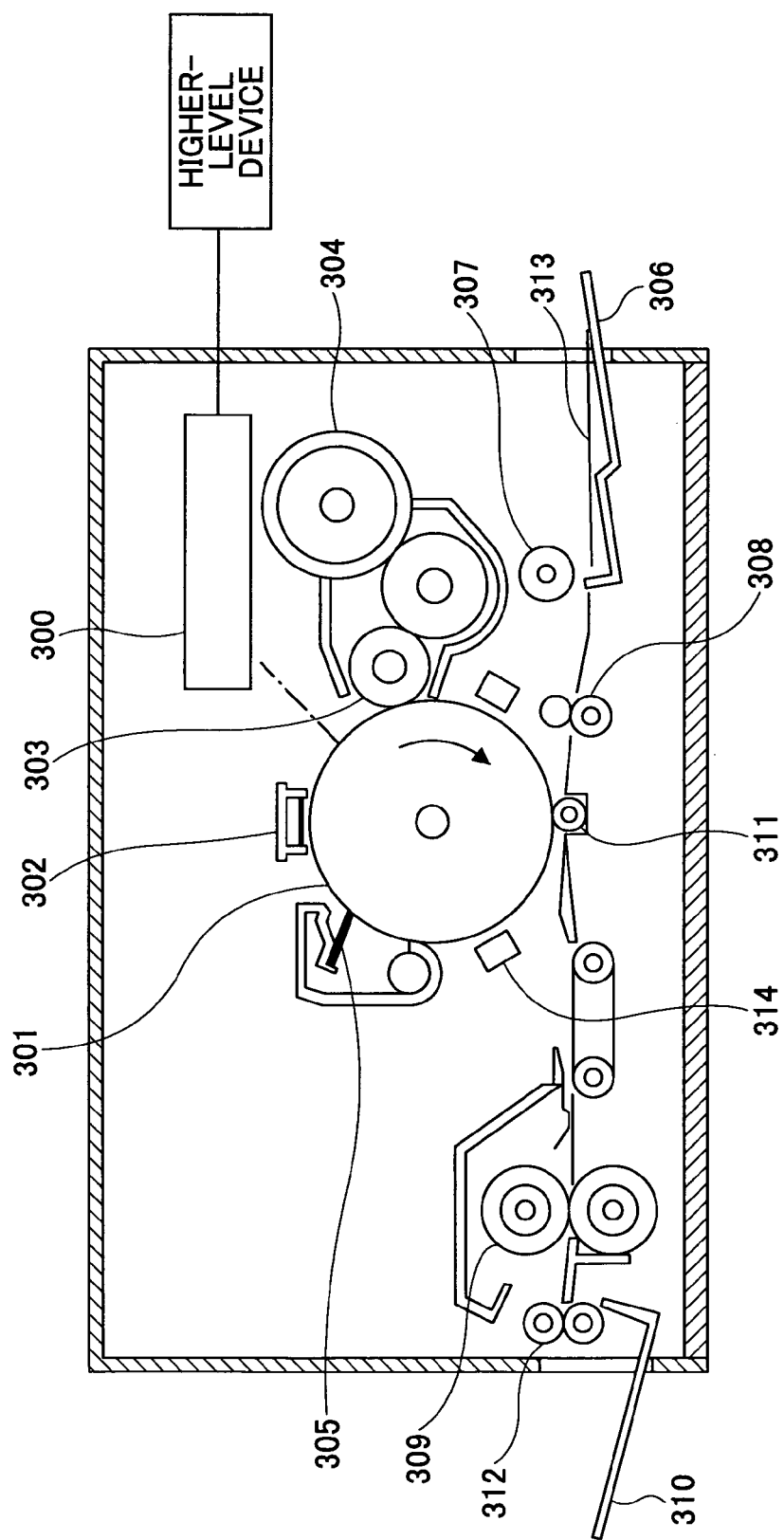
FIG. 10 illustrates a structure of a laser printer according to Embodiment 2.

FIG. 10 illustrates a structure of a laser printer as an image forming device of Embodiment 2.

The laser printer includes an optical scanning device 300, a photo conductor drum 301, an electric charger 302, a developing roller 303, a toner cartridge 304, a cleaning blade 305, a paper feeding tray 306, a paper feeding roller 307, paired resist rollers 308, a transfer charger 311, a neutralization unit 314, a fuser roller 309, an ejecting roller 312, an ejected paper receiving tray 310 or the like.

The electric charger 302, the developing roller 303, the transfer charger 311, the neutralization unit 314 and the cleaning blade 305 are provided in the vicinity of a surface of the photo conductor drum 301. The electric charger 302, the developing roller 303, the transfer charger 311, the neutralization unit 314, and the cleaning blade 305 are arranged around the photo conductor drum 301 along a rotational direction of the photo conductor drum 301.

A photosensitive layer is formed on the surface of the photo conductor drum 301. In this, the photo conductor drum 301 rotates in the clockwise direction (arrow direction) as viewed in FIG. 10.

The electric charger 302 uniformly charges the surface of the photo conductor drum 301.

The optical scanning device 300 emits a light modulated based on image information received from a higher-level device like a personal computer onto the surface of the photo conductor drum 301 that is charged by the charger 302. Therefore, a latent image corresponding to image information is formed on the surface of the photo conductor drum 301. The latent image formed here moves in a direction toward the developing roller 303 along the rotation of the photo conductor drum 301. A detailed description of the structure of the optical scanning device 300 is described below.

The toner cartridge contains toner. The toner is supplied to the developing roller 303.

The developing roller 303 makes the toner supplied from the toner cartridge 304 become attached to the latent image formed on the surface of the photo conductor drum 301 to make visualize the image information. A latent image with the toner attached to it moves in the direction of the developing roller 303 along the rotation of the photo conductor drum 311.

The paper feeding tray 306 contains recording paper 313. The paper feeding roller 307 is disposed in the vicinity of the paper feeding tray 306. The paper feeding roller 307 picks the recording papers one by one out of the paper feeding tray 306 and delivers these to the paired resist rollers 308. The paired resist rollers 308 are disposed in the vicinity of the transfer roller 311 to temporarily hold the recording papers 313 picked by the paper feeding roller 307, and simultaneously send the recording papers 313 one by one toward a gap between the photo conductor drum 301 and the transfer charger 311 along with the rotation of the photo conductor drum 301.

The transfer charger 311 is applied with a voltage of polarity reverse to that of the toner in order to electrically attract the toner on the surface of the photo conductor drum 301 to the recording paper 313. The latent image on the surface of the photo conductor drum 301 is transferred to the recording paper by the applied voltage. The transferred recording paper 313 is sent to the fuser roller 309.

The fuser roller 309 applies heat and pressure to the recording paper 313 to thereby fix the toner to the recording paper 313. The fixed recording papers 313 are sent to the ejected paper receiving tray 310 and stacked on the ejected paper receiving tray 310 in series.

The neutralization unit 314 removes electric charges on the surface of the photo conductor drum 301.

The cleaning blade 305 removes toner (residual toner) remaining on the surface of the photo conductor drum 301. The removed residual toner can be reused. The surface of the photo conductor drum 301, from which the residual toner is removed, returns to the position of the electric charger 302.

<Optical Scanning Device>

Figure 11:
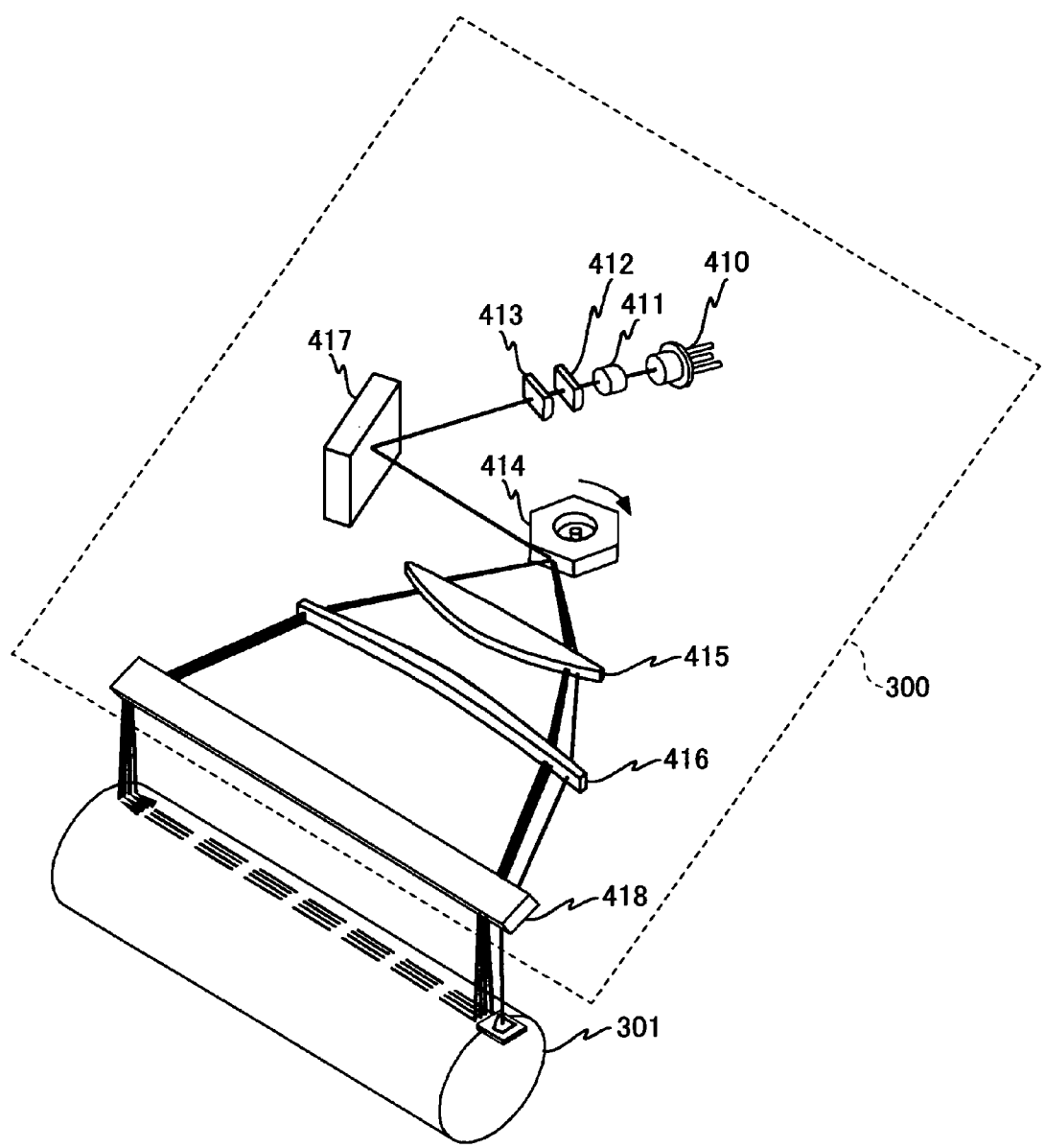
FIG. 11 illustrates a structure of an optical scanning device.

Referring to FIG. 11, a structure and a function of an optical scanning device 300 are described.

The optical scanning device 300 includes a light source unit 410 having a vertical cavity surface emitting laser array LA made of the vertical cavity surface emitting laser element of Embodiment 1, a coupling lens 411, an aperture 412, a cylindrical lens 413, a polygonal mirror 414, a fθ lens 415, a toroidal lens 416, two mirrors 417, 418, and a main control unit (not shown) for totally controlling the above elements.

The coupling lens 411 shapes a light beam emitted from the light source unit 410 into a substantially parallel light.

The aperture 412 determines a beam diameter of the light beam relayed by the coupling lens 411.

The cylindrical lens 413 converges the light beam having passed through the aperture 412 and to be reflected by the mirror 417 to a reflecting side of the polygonal mirror 414.

The polygonal mirror 414 is made of a regular hexagonal column member having a low height and has six deflected surfaces on a side of it. The polygonal mirror 414 is rotated at a predetermined angular speed in a direction of arrow illustrated in FIG. 11 by a rotating mechanism (not shown). Therefore, the light beam emitted from the light source unit 410 and converged to the deflected surfaces of the polygonal mirror 414 by the cylindrical lens 413 is deflected at a constant angular speed by the rotation of the polygonal mirror 414.

The fθ lens 415 builds up an image having a height proportional to an incident angle of the light beam from the polygonal mirror 414, and makes an image surface that is deflected by the polygonal mirror 414 at the constant angular speed move at a constant speed relative to a main scanning direction.

The light beam from the fθ lens 415 is transmitted through the toroidal lens 416, is reflected by the mirror 418, and forms an image on the surface of the photo conductor drum 301.

Referring to FIG. 12, vertical cavity surface emitting laser array LA having forty (40) vertical cavity surface emitting laser element channels is provided in the photo conductor drum 301, as an example. Perpendicular lines from centers of the vertical cavity surface emitting laser elements to a line parallel to sub scanning directions are arranged at even intervals d2. By adjusting timing of lighting the vertical cavity surface emitting laser elements, it is possible to obtain a function similar to that in a case where vertical cavity surface emitting laser elements are actually disposed on the photo conductor drum 301 in a line parallel to on the sub scanning directions at the even intervals d2. For example, when a pitch d1 of the ten (10) vertical cavity surface emitting laser elements for 360° rotation is 26.5 μm, the intervals become 2.65 μm.

Provided that the optical magnification of the above optical system is two times, it is possible to form write dots at 5.3 μm intervals in the sub scanning directions on the photo conductor drum 301. The 5.3 μm intervals correspond to 4800 dots per inch (dpi). Said differently, it is possible to achieve high-density writing of 4800 dpi. It is possible to achieve further high-density and high quality printing (writing) by increasing the number of the vertical cavity surface emitting laser elements for 360° rotation in the main scanning direction, changing the array structure by reducing the pitch d1 to reduce the intervals d2, or reducing the optical magnification of the above optical system. Then, gaps of printing (writing) in the main scanning direction can be easily controlled by changing the timing of lighting the vertical cavity surface emitting laser elements (light source).

When such a light source unit 301 is adopted, even though a dot density of a laser printer is high, it is possible to print without decreasing print speed. Further, it is possible to make the print speed further high when the dot density remains unchanged.

Since the vertical cavity surface emitting laser array LA has a step portion 43 in which there is contact between the mesa structure upper part 42 and the mesa structure lower part 41, having mutually different taper angles of their side surfaces, the outer diameter of the oxidation blocking layer can be obtained by measuring the width of the mesa structure at a portion lower than the step portion 43 included in the mesa structure lower part 41 during a manufacturing process. Therefore, accuracy of estimating the outer diameter of the oxidation blocking layer is high, and therefore deviation of a current blocking area is very small. Therefore, it is possible to increase the number of the vertical cavity surface emitting laser elements in the vertical cavity surface emitting laser array. Accordingly, it is possible to obtain a laser printer that forms finely drawn images at low cost and at great rates.

As described, since the light source unit 410 of the optical scanning device 300 of Embodiment 2 includes the vertical cavity surface emitting laser array LA, made of vertical cavity surface emitting laser elements of Embodiment 1, it is possible to obtain an optical scanning device which can highly finely scan a surface of a photo conductor drum 301 at a great rate and low cost.

Further, since the laser printer of Embodiment 2 includes the optical scanning device 300 including the vertical cavity surface emitting laser array LA, it is possible to obtain the laser printer that forms finely drawn images at a low cost and great rate.

By using the optical scanning device which can scan color images, it is possible to obtain an image forming apparatus that highly finely forms color images at a low cost and great rate.

Here, the image forming apparatus may be a tandem color machine for color imaging including plural photo conductor drums such as a photo conductor drum for black (K), a photo conductor drum for cyan (C), a photo conductor drum for magenta (M), and a photo conductor drum for yellow (Y).

The present invention is not limited to these embodiments, but variations and modifications may be made without departing from the scope of the present invention.

The present application is based on Japanese Priority Patent Applications No. 2009-065667 filed on Mar. 18, 2009 and No. 2009-217914 filed on Sep. 18, 2009 with the Japan Patent Office, the entire contents of which are hereby incorporated by reference.

The invention claimed is:

1. A vertical cavity surface emitting laser element including
   a substrate,
   a laminated body formed by sandwiching a semiconductor active layer with an upper reflecting mirror and a lower reflecting mirror and positioned on a surface of the substrate,
   a lower electrode connected to another surface of the substrate opposite to the surface, and
   an upper electrode connected to an upper surface of the upper reflecting mirror,
   wherein the upper reflecting mirror and the lower reflecting mirror are respectively fabricated by alternately laminating semiconductor films having different refractive indexes, and the vertical cavity surface emitting laser element emits laser light in a direction perpendicular to the surface of the substrate when an electric current is supplied between the upper electrode and the lower electrode,
   the vertical cavity surface emitting laser element comprising:
   a selective oxidation layer in the upper reflecting mirror having a current blocking structure made of an oxidized region and an unoxidized region; and
   a detectable portion which is formed on a side surface of a mesa structure shaped by the upper reflecting mirror including the selective oxidation layer and the active layer, thereby enabling detecting a position of the selective oxidation layer from a top of the laminated body in a depth direction of the laminated body,
   wherein the detectable portion is a step shaped by changing a taper angle of a side surface of the mesa structure,
   wherein the detectable portion is formed at a depth position corresponding to a depth position of the selective oxidation layer from the top of the laminated body at which the taper angle changes between a lower part and an upper part of the mesa structure,
   wherein an insulating film is formed on the side surface of the mesa structure, and
   wherein the upper electrode is formed on the insulating film, and
   a thickness of the upper electrode is greater than a height of the lower part of the mesa structure.

2. The vertical cavity surface emitting laser element according to claim 1, wherein a taper angle in the lower part of the mesa structure is greater than a taper angle in an upper part of the mesa structure.

3. The vertical cavity surface emitting laser element according to claim 1,
   wherein the active layer has a multiple quantum well structure.

4. The vertical cavity surface emitting laser according to claim 1,
   wherein the mesa structure is formed with a plasma etching, and a pressure applied at a time of forming the lower part of the mesa structure and a pressure applied at a time of forming the upper part of the mesa structure are different.

5. A vertical cavity surface emitting laser array comprising:
   plural vertical cavity surface emitting laser elements, each vertical cavity surface emitting laser element of the plural vertical cavity surface emitting laser elements including:
   a substrate,
   a laminated body formed by sandwiching a semiconductor active layer with an upper reflecting mirror and a lower reflecting mirror and positioned on a surface of the substrate,
   a lower electrode connected to another surface of the substrate opposite to the surface, and
   an upper electrode connected to an upper surface of the upper reflecting mirror,
   wherein the upper reflecting mirror and the lower reflecting mirror are respectively fabricated by alternately laminating semiconductor films having different refractive indexes, and the vertical cavity surface emitting laser element emits laser light in a direction perpendicular to the surface of the substrate when an electric current is supplied between the upper electrode and the lower electrode,
   the vertical cavity surface emitting laser element comprising:
   a selective oxidation layer in the upper reflecting mirror having a current blocking structure made of an oxidized region and an unoxidized region; and
   a detectable portion which is formed on a side surface of a mesa structure shaped by the upper reflecting min-or including the selective oxidation layer and the active layer, thereby enabling detecting a position of the selective oxidation layer from a top of the laminated body in a depth direction of the laminated body, wherein the detectable portion is a step shaped by changing a taper angle of a side surface of the mesa structure, wherein the detectable portion is formed at a depth position corresponding to a depth position of the selective oxidation layer from the top of the laminated body at which the taper angle changes between a lower part and an upper part of the mesa structure, wherein all insulating film is formed on the side surface of the mesa structure, and wherein the upper electrode is formed on the insulating film, and a thickness of the upper electrode is greater than a height of the lower part of the mesa structure.

6. An optical scanning device that scans a surface of an object with a light beam comprising:

a light source unit including the vertical cavity surface emitting laser array according to claim 5;

a deflection unit configured to deflect the light beam from the light source unit; and a scanning optical system configured to converge the deflected light beam onto the surface of the object.

7. An image forming apparatus comprising:

one or more image holding units;

one or more the optical scanning devices according to claim 6 configured to scan the one or more image holding units with a light beam corresponding to an image; and a transferring unit configured to transfer the image formed on the image holding unit onto a transferred object.

8. An optical scanning device that scans a surface of an object with plural beams comprising:

a light source unit including the vertical avity surface emitting ding to claim 5;

a deflection unit configured to deflect the plural light beams from the light source unit; and a scanning optical system configured to converge the deflected light beams to the surface of the object.

9. An image forming apparatus comprising:

one or more image holding units;

one or more of the optical scanning devices according to claim 8 configured to scan the one or more image holding units with plural light beams corresponding to an image; and a transferring unit configured to transfer the image formed on the image holding unit onto a transferred object.

* * * * *